(12) United States Patent
Murayama et al.

(10) Patent No.: US 7,564,395 B2
(45) Date of Patent: Jul. 21, 2009

(54) SUBRANGING CONVERTER FOR CONVERTING AN ANALOG SIGNAL INTO AN N-BIT DIGITAL SIGNAL

(75) Inventors: Shigemitsu Murayama, Nagasaki (JP); Kohei Kudo, Nagasaki (JP); Yasuhide Shimizu, Nagasaki (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/936,428

(22) Filed: Nov. 7, 2007

(65) Prior Publication Data
US 2008/0180296 A1 Jul. 31, 2008

(30) Foreign Application Priority Data
Nov. 8, 2006 (JP) .............................. 2006-303095

(51) Int. Cl.
*H03M 1/12* (2006.01)
(52) U.S. Cl. ........................................ 341/156; 341/155
(58) Field of Classification Search ................. 341/155, 341/156, 141
See application file for complete search history.

(56) References Cited

U.S. PATENT DOCUMENTS

| 5,581,255 | A | * | 12/1996 | Hsu ........................... 341/156 |
| 5,748,132 | A | * | 5/1998 | Matsuzawa ................... 341/156 |
| 6,590,518 | B1 | * | 7/2003 | Taft ............................ 341/156 |
| 7,215,274 | B2 | * | 5/2007 | Liu ............................. 341/156 |
| 2003/0218560 | A1 | * | 11/2003 | Mulder et al. ............... 341/159 |

FOREIGN PATENT DOCUMENTS

| JP | 09-162738 | 6/1997 |
| JP | 10-261075 | 9/1998 |
| JP | 11-275518 | 10/1999 |
| JP | 2001-054066 | 2/2001 |
| JP | 2003-309811 | 10/2003 |
| JP | 2004-007134 | 1/2004 |
| JP | 2004-040580 | 2/2004 |

OTHER PUBLICATIONS

An office action from the Japanese Patent Office for Japanese Patent document 2005-243290 issued Sep. 24, 2008.

* cited by examiner

*Primary Examiner*—Peguy JeanPierre
(74) *Attorney, Agent, or Firm*—Sonnenschein Nath & Rosenthal LLP

(57) ABSTRACT

A subranging analog-to-digital converter is disclosed. The converter includes: a divided voltage generation circuit that equally divides a range of a predetermined voltage, and generates $2^m+1$ divided voltages; a higher-order conversion circuit that generates a signal for higher-order m bits of the digital signal by comparing the analog signal with the $2^m-1$ or less of the $2^m+1$ divided voltages; a switch circuit that selects at least two of the $2^m+1$ divided voltages based on information provided by the higher-order conversion circuit; a lower-order conversion circuit that generates a signal for lower-order n bits (n=N−m) of the digital signal by comparing the analog signal with the divided voltages being a selection result of the switch circuit; and an encoder that generates the digital signal based on the signal provided by the higher-order conversion circuit and the signal provided by the lower-order conversion circuit.

3 Claims, 10 Drawing Sheets

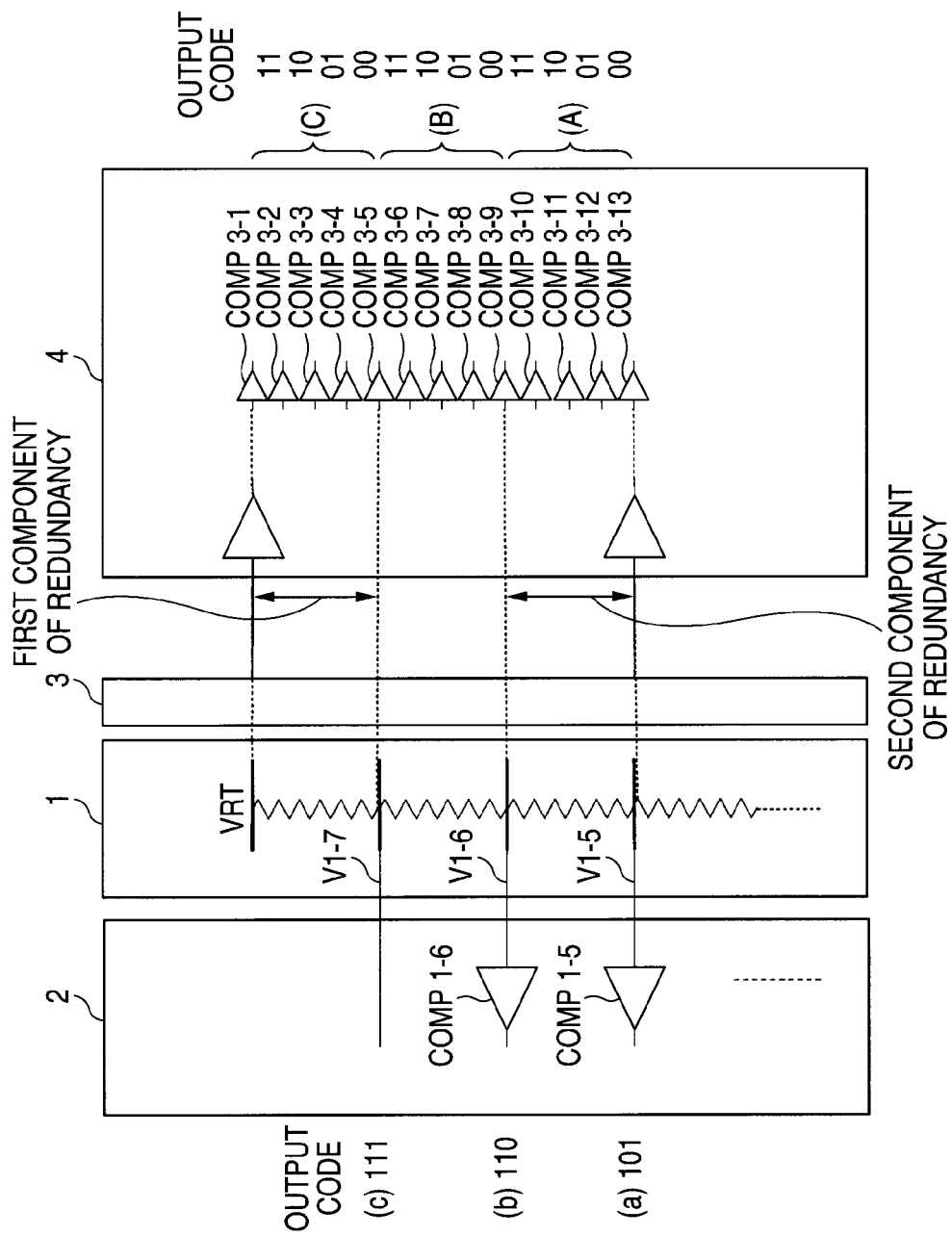

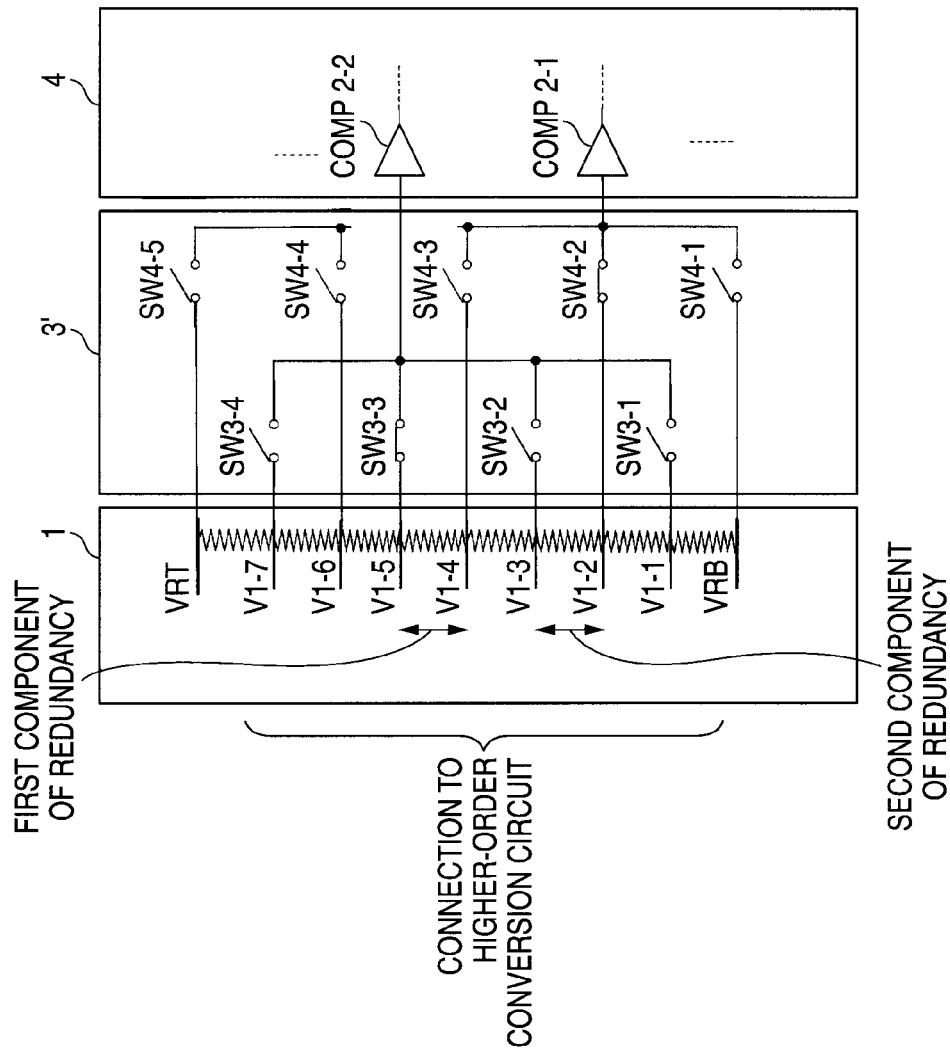

SUBRANGING CONVERTER FOR CONVERTING AN ANALOG SIGNAL INTO AN N-BIT DIGITAL SIGNAL

CROSS REFERENCES TO RELATED APPLICATIONS

The present invention contains subject matter related to Japanese Patent Application JP 2006-303095 filed in the Japanese Patent Office on Nov. 8, 2006, the entire contents of which being incorporated herein by reference.

BACKGROUND OF THE INVENTION

1. Field of the Invention

The present invention relates to an analog-to-digital converter.

2. Description of the Related Art

With the widespread use of digital equipment, an analog-to-digital (AD) converter for converting an analog signal into a digital signal has been used in various many fields.

Such an AD converter is known by a parallel AD converter that converts an incoming analog signal into an N-bit (N=n+m) digital signal in parallel, and a subranging AD converter that performs conversion into higher-order m bits and lower-order n bits, for example.

Such a subranging AD converter is considered superior to a parallel AD converter in terms of the smaller circuit size and less power consumption. As an example, refer to Patent Document 1 (JP-A-2004-7134).

Described now is a subranging AD converter for converting an analog signal into an N-bit digital signal.

Such a subranging AD converter is configured to include: a series resistance string, a higher-order conversion circuit, and a lower-order conversion circuit. The series resistance string equally divides the range between reference voltages, and generates $2^N$ divided voltages at regular intervals. The higher-order conversion circuit generates higher-order m bits of a digital signal based on the $2^m-1$ divided voltages at regular intervals. The lower-order conversion circuit generates lower-order n bits of the digital signal based on the $2^n$ divided voltages selected from the $2^N$ divided voltages by referring to information provided from the higher-order conversion circuit. In the subranging AD converter, the higher- and lower-order conversion circuits convert an incoming analog signal into an N-bit digital signal.

The issue here is an offset voltage possibly caused to the analog signal retained by a sample hold circuit (not shown) during comparison in the higher- and lower-order conversion circuits. The offset voltage may degrade the AD conversion in terms of linearity at a border portion of the higher-order bits. As an example, refer to Patent Document 2 (JP-A-9-162738). Herein, the offset voltage is a difference between error voltages observed at the time of voltage retention for the analog signal in higher- and lower-order-bit comparators of the higher- and lower-order conversion circuits, respectively.

As such, in the subranging AD converter of a previous type, a divided voltage is provided with redundancy for use in the lower-order-bit comparator in consideration of such an offset voltage.

FIG. 10 shows such a subranging AD converter in which a divided voltage for use in the lower-order-bit comparator is provided with redundancy. In this AD converter 10, higher-order three bits are subjected to conversion by a higher-order conversion circuit 13, and lower-order three bits are subjected to conversion by a lower-order conversion circuit 14 so that an incoming analog signal is converted into a six-bit digital signal.

As shown in FIG. 10, the AD converter 10 is configured to include a divided voltage generation circuit 11, the higher-order conversion circuit 13, a MUX (multiplexer) 12, and the lower-order conversion circuit 14. The divided voltage generation circuit 11 is configured by ladder resistors for generating a plurality of divided voltages by dividing the range of predetermined voltages (Va-Vb). The higher-order conversion circuit 13 serves to convert an incoming analog signal into a digital signal of higher-order three bits. The MUX 12 is a switch circuit that selects, for output, three of the divided voltages provided by the divided voltage generation circuit 11. The lower-order conversion circuit 14 serves to convert the analog signal into a digital signal of lower-order three bits based on the three divided voltages provided by the MUX 12.

In the higher-order conversion circuit 13, input terminals on one side of higher-order-bit comparators COMP10-1 to COMP10-7 are respectively connected with seven divided voltages V10-1 to V10-7, and input terminals on the other side thereof are respectively connected with analog signals for conversion. The seven divided voltages V10-1 to V10-7 are those generated by the divided voltage generation circuit 11 equally dividing, into eight, the range between a lower-order reference voltage (VRB) and a higher-order reference voltage (VRT).

By these higher-order-bit comparators COMP10-1 to COMP10-7, the higher-order conversion circuit 13 generates a digital signal of higher-order three bits.

For use of divided voltage output to the lower-order conversion circuit 14, the MUX 12 makes a switch selection based on information provided by the higher-order conversion circuit 13, i.e., selects any one of switches SW10-1 to SW10-8, any one of switches SW11-1 to SW11-8, and anyone of switches SW12-1 to SW12-8. That is, the MUX 12 causes thus selected three switches to short circuit through control thereover, and outputs three divided voltages generated by the divided voltage generation circuit 11 to the lower-order conversion circuit 14.

The information provided by the higher-order conversion circuit 13 indicates the range of the voltage of an incoming analog signal, i.e., in which range the voltage of the analog signal is located between any two of the divided voltages V10-1 to V10-7. Assuming that when the voltage of an incoming analog signal is in the range between the divided voltages V10-2 and V10-3, information indicating as such is notified. In this case, based on such information provided by the higher-order conversion circuit 13, the MUX 12 selects the switches SW10-3, SW11-3, and SW12-3.

In this example, after the switch selection made based on the information provided by the higher-order conversion circuit 13, the MUX 12 is allowed to select the range of a voltage being the lowest voltage unit in the higher-order conversion circuit 13 plus a component of redundancy. Such a voltage unit denotes a voltage between any of the adjacent divided voltages V10-1 to V10-7, and hereinafter may be referred to as "LSB". When the information provided by the higher-order conversion circuit 13 indicates that the voltage of an analog signal is in the range between the divided voltages V10-4 to V10-5, the lower-order conversion circuit 14 selects the switches SW10-5, SW11-5, and SW12-5, and causes these switches to short circuit. The lower-order conversion circuit 14 then selects, for the range between the divided voltages V10-4 and V10-5, a voltage range added with first and second components of redundancy, and an intermediate voltage therebetween for output to the lower-order-bit comparators COMP11-1 to COMP11-3. The first component of redundancy is higher than the divided voltage V10-5 by a predetermined value, and the second component of redundancy is lower than the divided voltage V10-4 by the predetermined value. The lower-order conversion circuit 14 then generates a digital signal of lower-order three bits with respect to an analog signal provided based on signals coming from the lower-order-bit comparators COMP11-1 to COMP11-3. Note here that the lower-order conversion circuit 14 is configured by the lower-order-bit comparators COMP11-1 to COMP11-3, and a known interpolation circuit that is not shown.

SUMMARY OF THE INVENTION

The problem with such a previous AD converter 10, the redundancy in the lower-order conversion circuit 14 is lower than the minimum voltage unit (LSB) in the higher-order conversion circuit 13. This thus causes the necessity of providing the higher-order-bit comparators COMP10-1 to COMP10-7 to the divided voltages V10-1 to V10-7, respectively, in the higher-order conversion circuit 13, thereby increasing the power consumption.

Moreover, the MUX 12 is required to be equipped with switches for establishing connections to the lower-order-bit comparators COMP11-1 to COMP11-3 every time information coming from the higher-order conversion circuit 13 is changed. These switches increase the load on the lower-order conversion circuit 14, thereby resulting in a drawback in terms of settling during comparison in the lower-order conversion circuit 14.

According to an embodiment of the present invention, there is provided a subranging analog-to-digital (AD) converter that converts, for output, an incoming analog signal into an N-bit digital signal. The converter includes: a divided voltage generation circuit that equally divides a range of a predetermined voltage, and generates $2^m+1$ divided voltages; a higher-order conversion circuit that generates, for output, a signal for higher-order m bits of the digital signal by comparing the analog signal with the $2^m-1$ or less of the $2^m+1$ divided voltages; a switch circuit that selects, for output, at least two of the $2^m+1$ divided voltages based on information provided by the higher-order conversion circuit; a lower-order conversion circuit that generates, for output, a signal for lower-order n bits (n=N−m) of the digital signal by comparing the analog signal with the divided voltages being a selection result of the switch circuit; and an encoder that generates the digital signal based on the signal provided by the higher-order conversion circuit and the signal provided by the lower-order conversion circuit. In the converter, the switch circuit selects, from the $2^m+1$ divided voltages, a first divided voltage being higher by a predetermined value compared with any two of the divided voltages closest to a voltage of the analog signal, and a second divided voltage being lower by the predetermined value compared therewith.

According to another embodiment of the present invention, in the first embodiment, when the first divided voltage is to exceed any of the $2^m+1$ divided voltages being the highest, the switch circuit sets the highest divided voltage as the first divided voltage, and sets, as the second divided voltage, any of the $2^m+1$ divided voltages being lower than the first divided voltage by a difference of r (r is an even number of 2 or more) of the divided voltages, and when the second divided voltage is to fall below any of the $2^m+1$ divided voltages being the lowest, the switch circuit sets the lowest divided voltage as the second divided voltage, and sets, as the first divided voltage, any of the $2^m+1$ divided voltages being higher than the second divided voltage by a difference of r (r is an even number of 2 or more) of the divided voltages.

According to a further embodiment of the present invention, in the first or second embodiment, the lower-order conversion circuit includes a first lower-order-bit comparator and a second lower-order-bit comparator. The switch circuit includes: $2^m/2$ pieces of a first switch for use to connect, to the first lower-order-bit comparator, any of the $2^m+1$ divided voltages located at an even-numbered position from the lowest divided voltage; and $2^m/2+1$ pieces of a second switch for use to connect, to the second lower-order-bit comparator, any of the $2^m+1$ divided voltages located at an odd-numbered position from the lowest divided voltage, and the switch circuit performs a divided voltage selection through control over the first and second switches, and outputs a selection result to the first and second lower-order-bit comparators.

According to a still further embodiment of the present invention, in any of the first to third embodiments, the higher-order conversion circuit includes a plurality of higher-order comparators for comparing the analog signal with any of the $2^m-1$ divided voltages at least not including the highest and lowest divided voltages.

In the embodiments of the invention, a divided voltage to be selected by the switch circuit is the one including a first divided voltage being higher by a predetermined value compared with two of the divided voltages closest to the voltage of an incoming analog signal, and a second divided voltage being lower by the predetermined value compared therewith. This accordingly eliminates the need for providing a higher-order-bit comparator to each of divided voltages for higher-order bits in the higher-order conversion circuit so that the power consumption can be prevented from being increased. What is better, the number of switches can be reduced in the switch circuit.

BRIEF DESCRIPTION OF THE DRAWINGS

FIG. 5 is another diagram for illustrating the encoding processing method by the encoder;

FIG. 6 is a diagram for illustrating a MUX of FIG. 2;

DETAILED DESCRIPTION OF THE INVENTION

In the below, described is an analog-to-digital (AD) converter in an embodiment by referring to the accompanying drawings. This AD converter converts an incoming analog signal Vin into an N-bit digital signal before output. In the below, exemplified is a five-bit subranging AD converter A in which an analog signal Vin that has been sample-held by a sample hold circuit (not shown) is detected to higher-order three bits of a digital signal, and then detects the remaining lower-order two bits of the digital signal. The numbers of the higher- and lower-order bits are surely not restrictive thereto.

Figure 1:
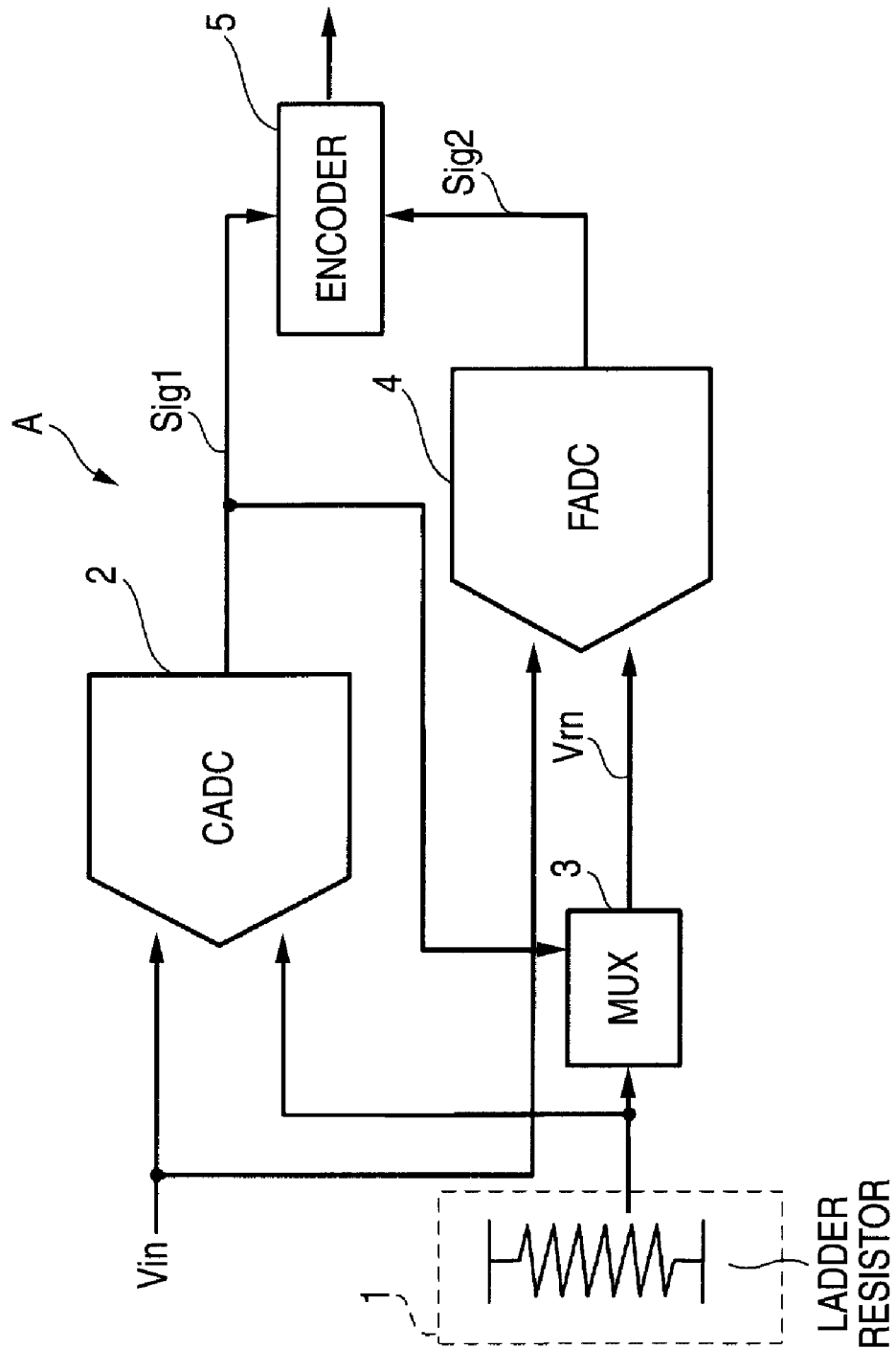
FIG. 1 is a diagram showing the schematic configuration of an analog-to-digital (AD) converter in an embodiment of the invention.

As shown in FIG. 1, the AD converter A in this embodiment is configured to include a divided voltage generation circuit 1, a higher-order conversion circuit 2, a MUX (multiplexer) 3, a lower-order conversion circuit 4, and an encoder 5. The divided voltage generation circuit 1 is configured by ladder resistors for generating nine divided voltages by dividing the range between predetermined voltages (VRT-VTB). The nine divided voltages include the reference voltages. The higher-order conversion circuit 2 serves to convert, for output, an incoming analog signal Vin into a signal Sig1 of higher-order three bits. This conversion is performed based on the divided voltages provided by the divided voltage generation circuit 1, i.e., based on seven or less divided voltages not including the reference voltages. The MUX (multiplexer) 3 is a switch circuit that selects, for output, two of the nine divided voltages provided by the divided voltage generation circuit 1. The lower-order conversion circuit 4 serves to convert, for output, the analog signal Vin into a signal Sig2 for lower-order two bits based on the divided voltages Vrn provided by the MUX 3. The encoder 5 generates a five-bit digital signal corresponding to the incoming analog signal. This signal generation is performed based on the signal Sig1 provided by the higher-order conversion circuit 2, and the signal Sig2 provided by the lower-order conversion circuit 4.

Figure 2:
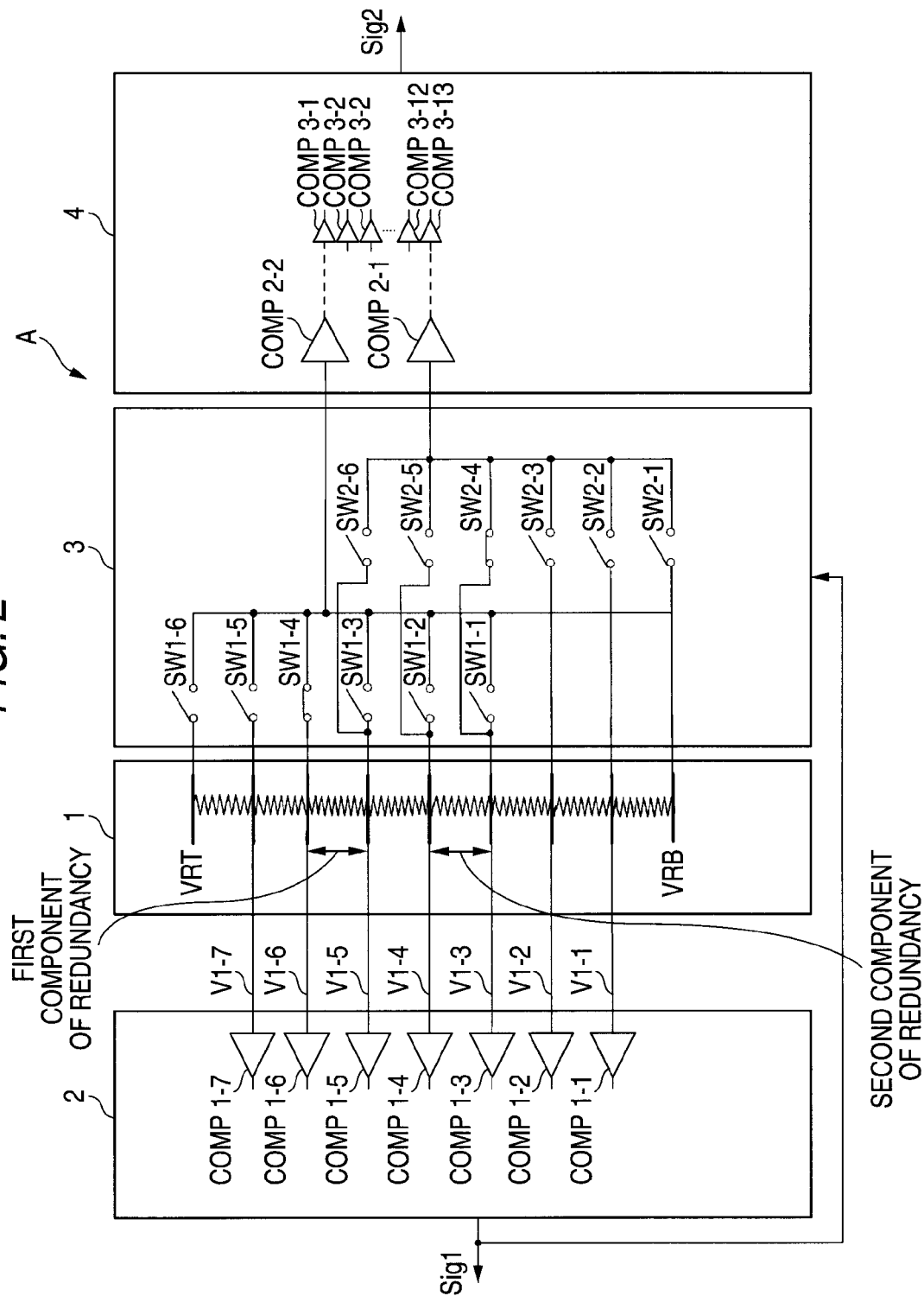
FIG. 2 is a diagram showing the specific configuration of the AD converter in the embodiment of the invention.

By referring to FIG. 2, the relationship is described specifically among the divided voltage generation circuit 1, the higher-order conversion circuit 2, the MUX 3, and the lower-order conversion circuit 4.

The divided voltage generation circuit 1 equally divides the range between a lower-order reference voltage (VRB) and a higher-order reference voltage (VRT) both being reference voltages, and generates nine divided voltages including the lower-order reference voltage (VRB) and the higher-order reference voltage (VRT).

In the higher-order conversion circuit 2, input terminals on one side of higher-order-bit comparators COMP1-1 to COMP1-7 are respectively connected with seven divided voltages V1-1 to V1-7, and input terminals on the other side thereof are respectively connected with analog signals Vin to be converted into digital signals. The seven divided voltages V1-1 to V1-7 are a part of the nine divided voltages being the results of equally dividing the range between the lower-order reference voltage (VRB) and the higher-order reference voltage (VRT) into eight by the divided voltage generation circuit 1. The seven divided voltages V1-1 to V1-7 are not including the lower-order reference voltage (VRB) and the higher-order reference voltage (VRT).

Based on the comparison result derived by these higher-order-bit comparators COMP1-1 to COMP1-7 for between the divided voltages and the provided analog signal Vin, the higher-order conversion circuit 2 generates a signal Sig1 of higher-order three bits.

Based on the signal Sig1 being information provided by the higher-order conversion circuit 2, the MUX 3 makes a switch selection from reference switches SW1-1 to SW1-6 and SW2-1 to SW2-6 for divided voltage output to the lower-order conversion circuit 4. That is, based on the comparison result derived in the higher-order conversion circuit 2 for between the provided analog signal Vin and the divided voltages V1-1 to V1-7, one of the reference switches SW1-1 to SW1-6 is so controlled as to short circuit, and one of the reference switches SW2-1 to SW2-6 is so controlled as to short circuit. Through such control, two of the divided voltages generated by the divided voltage generation circuit 1 are selected for output to the lower-order conversion circuit 4.

Herein, the signal Sig1 provided by the higher-order conversion circuit 2 is information indicating the range of the voltage of an incoming analog signal, i.e., in which range the voltage of the signal is located between any two of the divided voltages V1-1 to V1-7. Assuming that when the voltage of an incoming analog signal is in the range between the divided voltages V1-4 and V1-5, the signal indicates information as such. The information as such is about that the voltage of the analog signal is equal to or higher than the divided voltage V1-4 but lower than the divided voltage V1-5, and is a signal being the comparison result derived by the higher-order-bit comparators COMP1-1 to COMP1-7 for between the divided voltages V1-1 to V1-7 and the provided analog signal Vin.

After the switch selection made based on the information provided by the higher-order conversion circuit 2, the MUX 3 is allowed to select the range of a voltage being the minimum voltage unit in the higher-order conversion circuit 2 plus a component of redundancy of ±1 LSB. Such a voltage unit denotes a voltage between any of the adjacent divided voltages, and hereinafter may be referred to as "LSB". When the voltage of an analog signal Vin is in the range between the divided voltages V1-4 to V1-5, the lower-order conversion circuit 4 selects the reference switches SW1-4 and SW2-4, and turns these switches ON. The lower-order conversion circuit 4 then selects the range of a voltage being the addition of the component of redundancy and the range between the divided voltages V1-4 to V1-5. That is, the lower-order conversion circuit 4 selects the divided voltage V1-6 as a voltage of a first component of redundancy, i.e., voltage higher than the divided voltage V1-5 by 1 LSB, and the divided voltage V1-4 as a voltage of a second component of redundancy, i.e., voltage lower than the divided voltage V1-4 by 1 LSB. Thus selected voltages are forwarded to the lower-order-bit comparators COMP2-2 and COMP2-1, respectively.

The lower-order conversion circuit 4 uses any known interpolation circuit to generate the signal Sig2 for lower-order two bits from the outputs of the lower-order-bit comparators COMP2-1 and COMP2-2. This signal generation is performed in the range of three LSBs of the higher-order conversion circuit 2. Note that the interpolation circuit includes the comparators COMP3-1 to COMP3-13.

As such, the MUX 3 is provided with redundancy for the aim of correcting any offset, i.e., offset voltage, caused in the incoming analog signal Vin retained by a sample hold circuit (not shown) during comparison in the higher- and lower-order conversion circuits 2 and 4 for between the analog signal Vin and the divided voltages. With this redundancy set to ±1 LSB, the comparators in the higher-order conversion circuit 2 can be reduced in number so that the power consumption can be reduced thereby.

Figure 3:
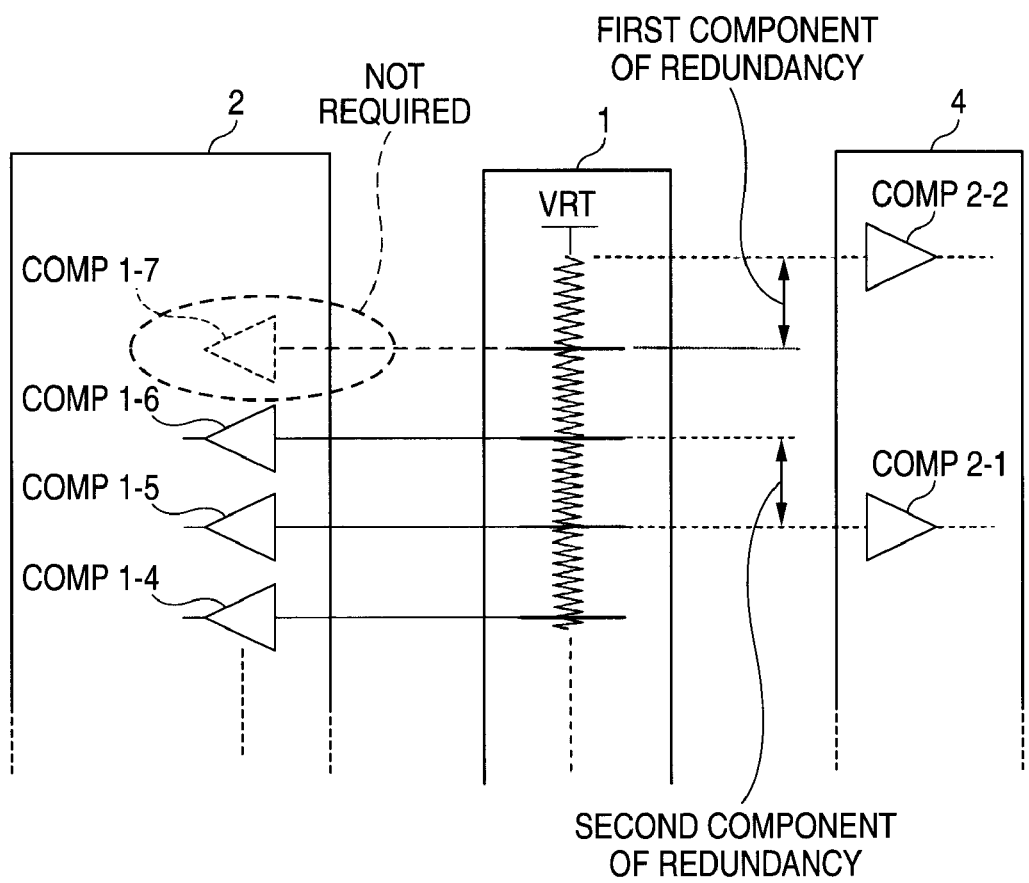
FIG. 3 is a diagram for illustrating higher-order-bit comparators of FIG. 2.

That is, the lower-order conversion circuit 4 is provided with the redundancy of ±1 LSB as above, and conversion of any lower-order bits is possible in the range of three LSBs of the higher-order conversion circuit 2. As such, as shown in FIG. 3, when the voltage of an analog signal is equal to or higher than the divided voltage V1-6, the MUX 3 causes the switches SW1-6 and SW2-6 to short circuit. This accordingly eliminates the need for the higher-order-bit comparator COMP1-7 in the higher-order conversion circuit 2. Similarly, when the voltage of an analog signal is lower than the divided voltage V1-2, the MUX 3 causes the switches SW1-1 and SW2-1 to short circuit. This accordingly eliminates the need for the higher-order-bit comparator COMP1-1 in the higher-order conversion circuit 2.

As such, with the redundancy set to ±1 LSB, and with the low-bit conversion performed in the range of three LSBs of the higher-order conversion circuit 2, the need is eliminated for the higher-order-bit comparators COMP1-1 and COMP1-7 for the divided voltages V1-1 and V1-7.

Figure 4:
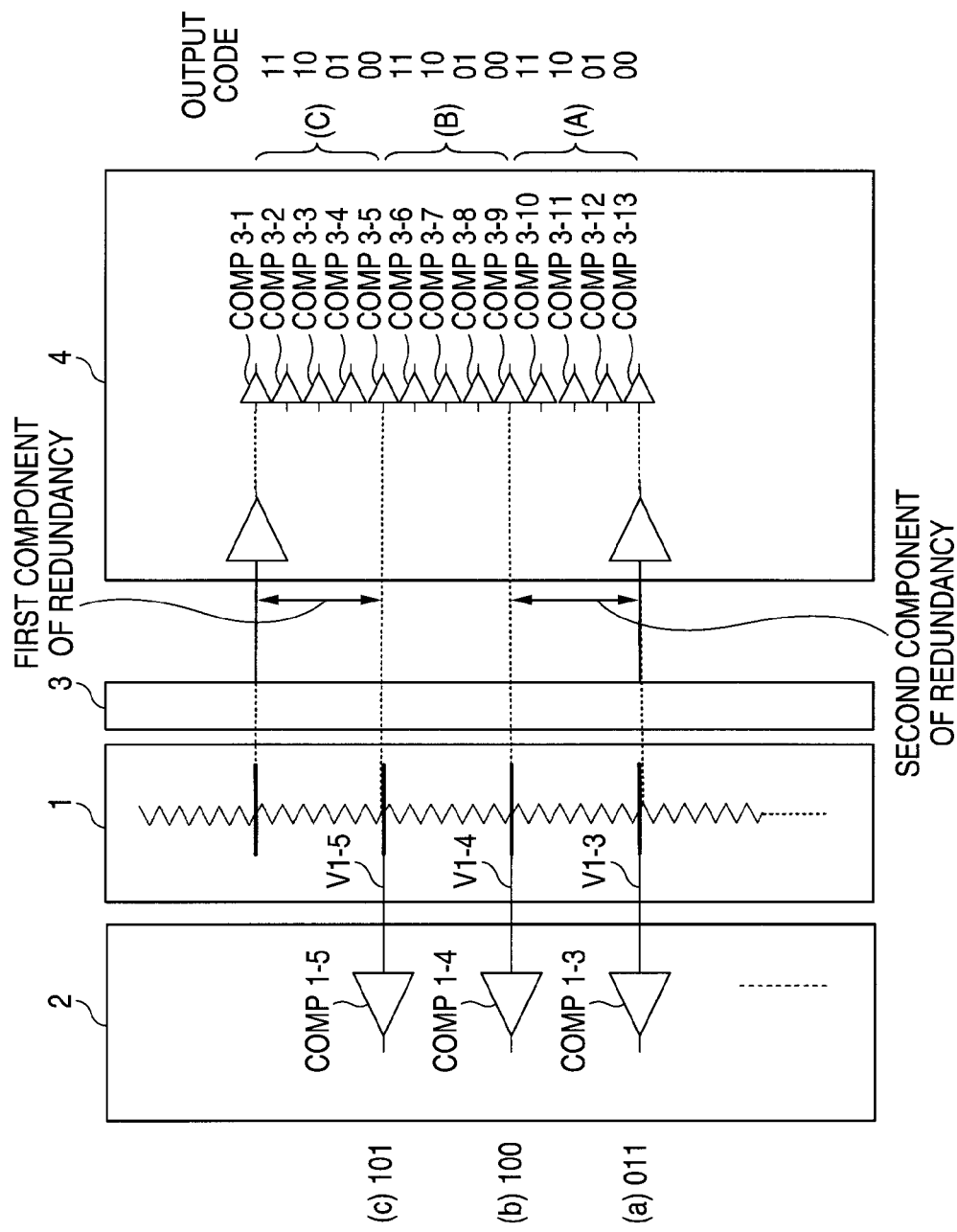
FIG. 4 is a diagram for illustrating an encoding processing method by an encoder.

Described now is encoding processing for a digital signal in the encoder 5 when the lower-order conversion circuit 4 is provided with redundancy. FIG. 4 is a diagram for illustrating an encoding processing method when the redundancy is a voltage being equal to or higher than the divided voltage V1-1 and lower than the divided voltage V1-7, and FIG. 5 is a diagram for illustrating the encoding processing method when the redundancy is a voltage being lower than the divided voltage V1-1 or a voltage being equal to or higher than the divided voltage V1-7.

When the redundancy is a voltage being equal to or higher than the divided voltage V1-1 and lower than the divided voltage V1-7, the encoder 5 adds "1" to or subtracts "1" from data of three bits corresponding to the signal Sig1 provided by the higher-order conversion circuit 2. For example, as shown in FIG. 4, in the higher-order conversion circuit 2, when the voltage of the incoming signal Vin is in the range between the divided voltages V1-4 and V1-5, data of three bits corresponding to the signal Sig1 provided by the higher-order conversion circuit 2 is "100" in binary. In the lower-order conversion circuit 4, the redundancy is a voltage in the range between the divided voltages V1-3 and V1-4, and a voltage in the range between the divided voltages V1-5 and V1-6. With such redundancies, i.e., when the voltage of an incoming signal Vin in the lower-order conversion circuit 4 is in the portion of the second component of redundancy between the divided voltages V1-3 and V1-4 (refer to (A) of FIG. 4), the encoder 5 subtracts "1" from the data of three bits corresponding to the higher-order bit signal Sig1 provided by the higher-order conversion circuit 2, and derives "011" for higher-order bits (refer to (a) of FIG. 4). When the voltage of an incoming signal Vin in the lower-order conversion circuit 4 is in the portion of the first component of redundancy between the divided voltages V1-5 and V1-6 (refer to (c) of FIG. 4), the encoder 5 adds "1" to the data of three bits corresponding to the signal Sig1 provided by the higher-order conversion circuit 2, and derives "101" for higher-order bits (refer to (c) of FIG. 4).

Similarly, also in a case where the redundancy is a voltage being lower than the divided voltage V1-1 or a voltage equal to or higher than the divided voltage V1-7, the encoder 5 adds "1" to or subtracts "1" from the data of three bits corresponding to the signal Sig1 provided by the higher-order conversion circuit 2. For example, as shown in FIG. 5, in the higher-order conversion circuit 2, when the voltage of the incoming signal Vin is in the range between the divided voltages V1-5 and V1-6, the data of three bits corresponding to the signal Sig1 provided by the higher-order conversion circuit 2 is "110" in binary. In the lower-order conversion circuit 4, the redundancy is a voltage between the divided voltages V1-5 and V1-6, and a voltage between the divided voltages V1-7 and the higher-order reference voltage VRT. With such redundancies, i.e., when the voltage of an incoming signal Vin in the lower-order conversion circuit 4 is in the portion of the first component of redundancy between the divided voltages V1-7 and the higher-order reference voltage VRT (refer to (c) of FIG. 5), the encoder 5 adds "1" to the data of three bits corresponding to the signal Sig1 provided by the higher-order conversion circuit 2, and derives "111" for higher-order bits (refer to (c) of FIG. 5).

As such, with the subranging AD converter A in this embodiment, when the lower-order conversion circuit 4 is provided with redundancy, the encoder 5 adds "1" to or subtracts "1" from the information of the signal Sig1 provided by the higher-order conversion circuit 2 for generation of higher-order bits of the incoming signal Vin. This thus eliminates the need for the higher-order-bit comparators COMP1-1 and COMP1-7 for the divided voltages V1-1 and V1-7.

With the configuration of FIG. 6, i.e., the MUX 3 is configured by the first reference switches SW3-1 to SW3-4, and the second reference switches SW4-1 and SW4-5, the number of switches can be reduced to a further extent for connection establishment between the divided voltage generation circuit 1 and the lower-order-bit comparators COMP2-1 and COMP2-2.

That is, the MUX 3 is configured by four first reference switches SW3-1 to SW3-4, and five second reference switches SW4-1 to SW4-5. The first reference switches SW3-1 to SW3-4 are used for connecting, to the first lower-order bit comparator COMP2-2, the divided voltages at even-numbered positions from the divided voltage VRB being the lowest in the nine divided voltages, i.e., V1-1, V1-3, V1-5, and V1-7. The second reference switches SW4-1 to SW4-5 are used for connecting, to the second lower-order bit comparator COMP2-1, the divided voltages at odd-numbered positions from the divided voltage VRB being the lowest in the nine divided voltages, i.e., VBT, V1-2, V1-4, V1-6, and VRT. These first and second reference switches SW3-1 to SW3-4 and SW4-1 to SW4-5 are controlled for a divided voltage selection, and the selection results are output to the first and second lower-order-bit comparators COMP2-2 and COMP2-1, respectively.

In this case, the divided voltage to be provided to the second lower-order-bit comparator COMP2-1 may be higher than the divided voltage to be provided to the first lower-order-bit comparator COMP2-2. If this is the case, the encoder 5 inverts the signal Sig2 coming from the lower-order conversion circuit for voltage correction.

Figures 7A, 7B, 7C:
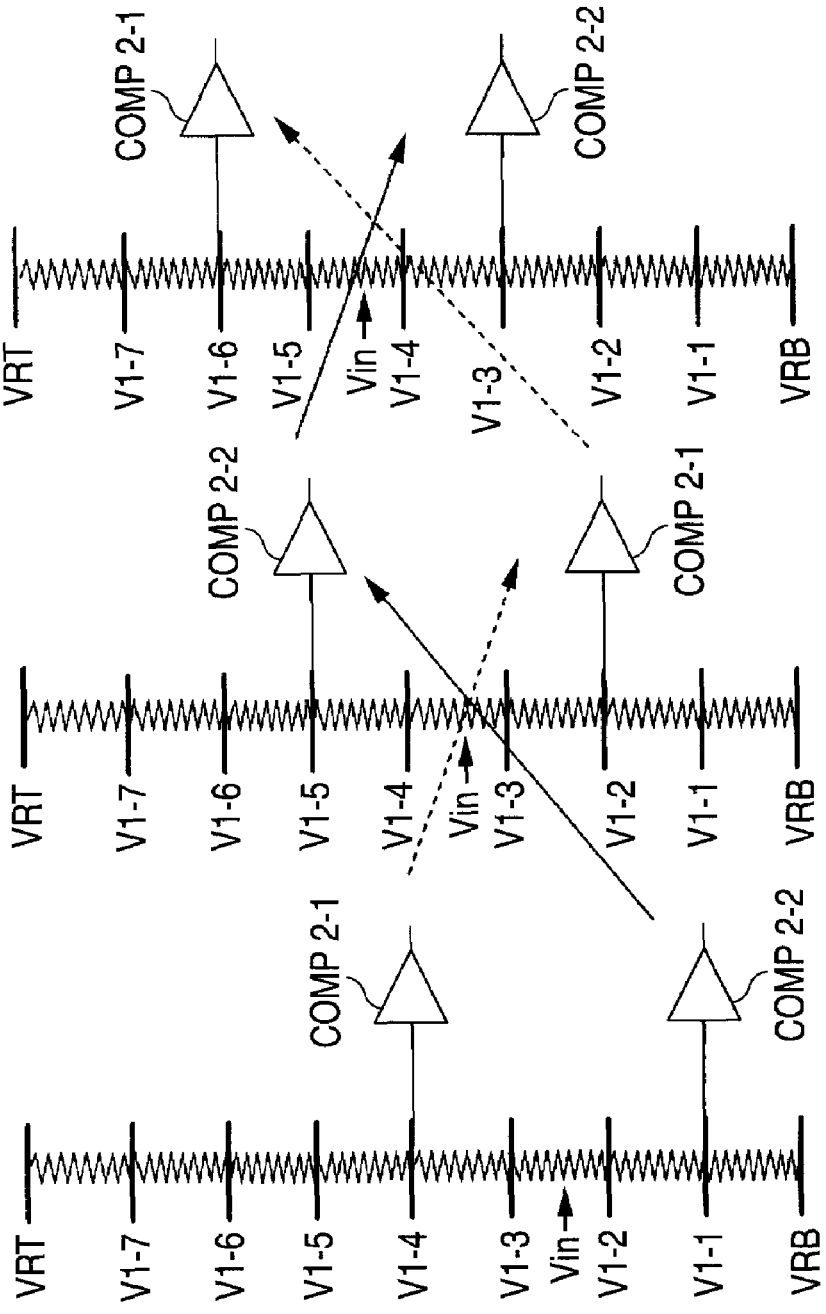
FIGS. 7A to 7C are each a diagram for illustrating the relationship between the MUX and lower-order-bit comparators.

That is, as shown in FIG. 7A, when the voltage of an analog signal Vin takes a value between the divided voltages V1-2 and V1-3, the second lower-order-bit comparator COMP2-1 is provided with the divided voltage V1-4, which is higher than the divided voltage V1-1 for input to the first lower-order-bit comparator COMP2-2. As shown in FIG. 7C, when the voltage of an analog signal Vin takes a value between the divided voltages V1-4 and V1-5, the second lower-order-bit comparator COMP2-1 is provided with the divided voltage V1-6, which is higher than the divided voltage V1-3 for input to the first lower-order-bit comparator COMP2-2. On the other hand, as shown in FIG. 7B, when the voltage of an analog signal Vin takes a value between the divided voltages V1-3 and V1-4, the second lower-order-bit comparator COMP2-1 is provided with the divided voltage V1-2, which is lower than the divided voltage V1-5 for input to the first lower-order-bit comparator COMP2-2.

As such, although voltage correction is required by the encoder 5, the switches can be reduced in number, i.e., twelve switches required in the configuration of FIG. 2 is favorably reduced to nine switches. Accordingly, in the lower-order conversion circuit 4, the settling speed can be increased during comparison in the lower-order-bit comparators COMP2-1 and COMP2-2, thereby achieving speed enhancement.

Figure 8:
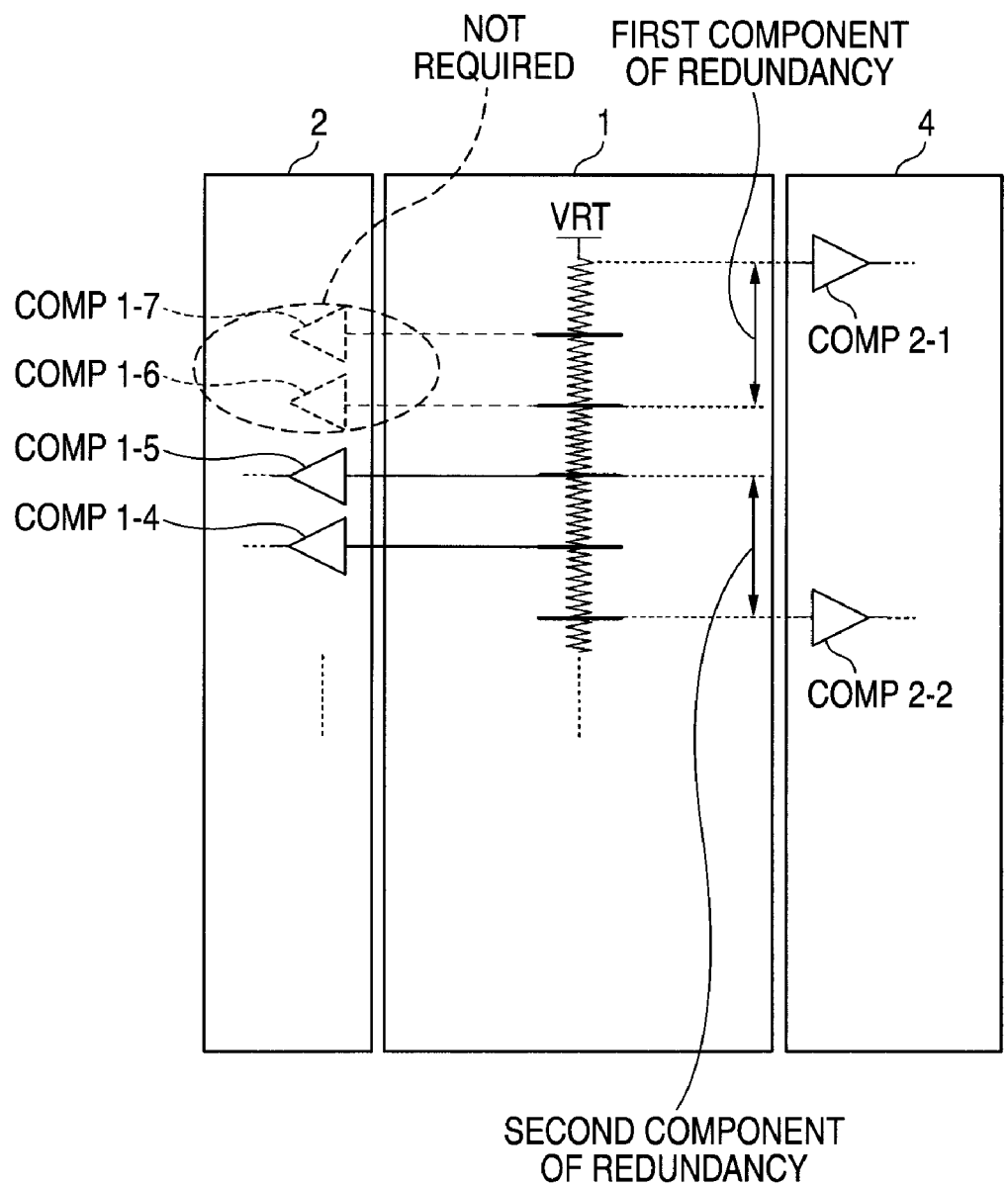
FIG. 8 is a diagram for illustrating another MUX.

In the configurations of FIGS. 2 to 7, the redundancy in the lower-order conversion circuit 4 is set to ±1 LSB. Alternatively, the redundancy therein may be ±2 LSB as shown in FIG. 8.

With the redundancy set to ±2 LSB as such, the high-order-bit comparators COMP1-1 to COMP1-7 in the higher-order conversion circuit 2 can be reduced in number, i.e., the comparators COMP1-1, COMP1-2, COMP2-6, and COMP2-7 are not needed any more, so that the power consumption can be reduced to a further extent thereby.

Figure 9:
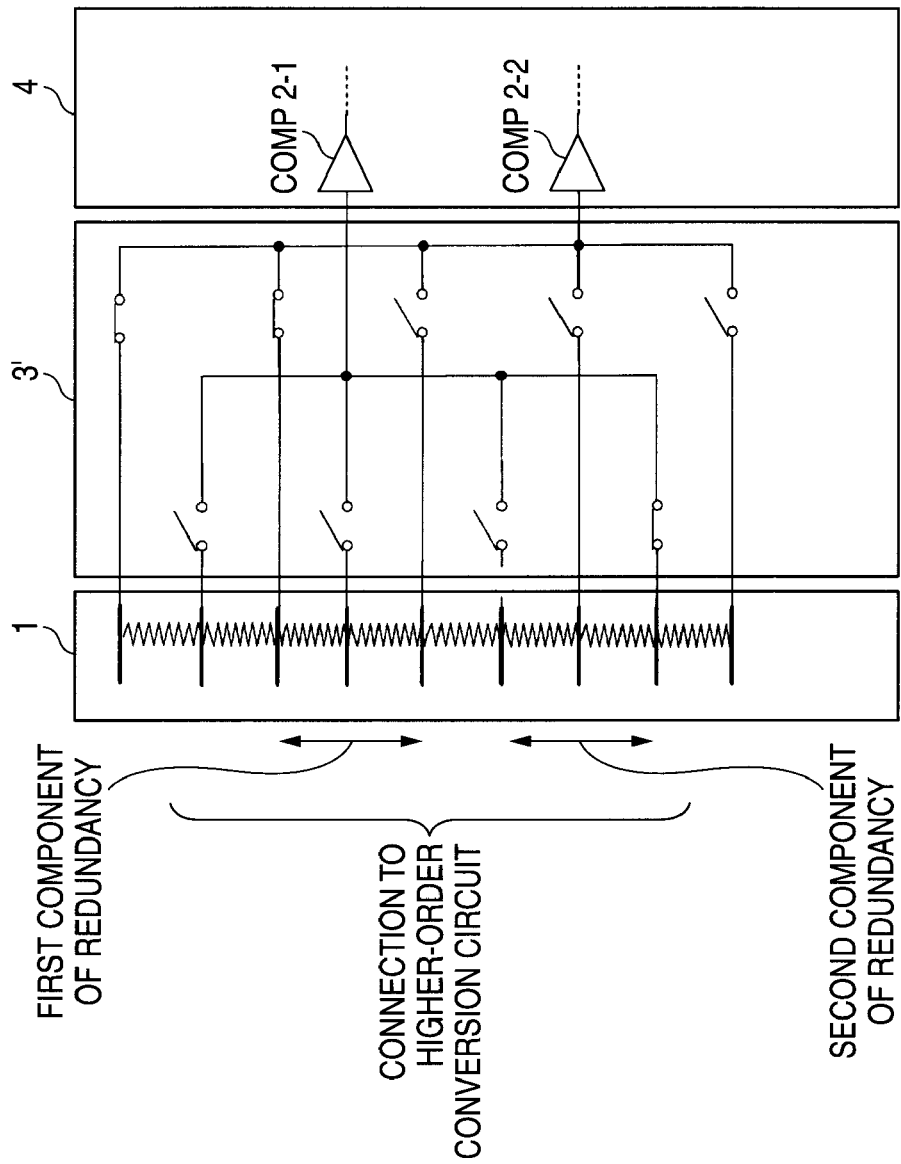
FIG. 9 is a diagram for illustrating the relationship between the MUX of FIG. 6 and the lower-order-bit comparators.
Figure 10:
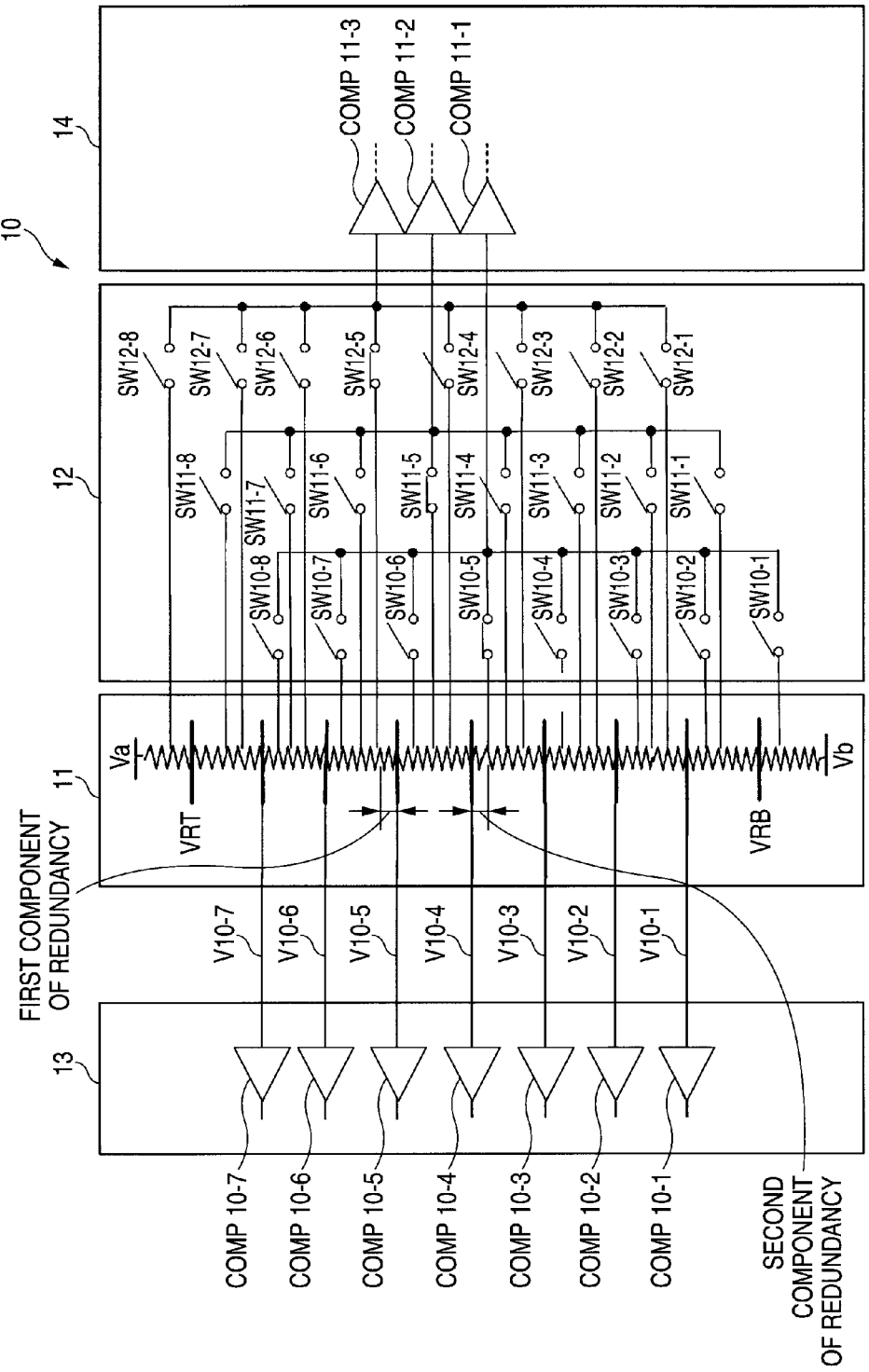
FIG. 10 is a diagram showing the specific configuration of a previous AD converter.

Moreover, as shown in FIG. 9, similarly to the configuration of the MUX 3 in FIG. 6, the divided voltages V1-1 to V1-7 are each provided with a switch. With such a configuration, in the lower-order conversion circuit 4, the settling speed can be increased during comparison in the lower-order-bit comparators, thereby achieving speed enhancement.

As described in the foregoing, a subranging AD converter in the embodiment converts, for output, an incoming analog signal Vin into an N-bit digital signal. The converter includes: a divided voltage generation circuit that equally divides the range of a predetermined voltage, and generates $2^m+1$ divided voltages; a higher-order conversion circuit that generates, for output, a signal Sig1 for higher-order m bits of the digital signal by comparing the analog signal Vin with the $2^m-1$ or less of the $2^m+1$ divided voltages; a MUX (multiplexer) being a switch circuit that selects, for output, at least two of the $2^m+1$ divided voltages based on information provided by the higher-order conversion circuit; a lower-order conversion circuit that generates, for output, a signal for lower-order n bits (n=N−m) of the digital signal by comparing the analog signal Vin with the divided voltages being a selection result of the switch circuit; and an encoder that generates the digital signal based on the signal provided by the higher-order conversion circuit and the signal provided by the lower-order conversion circuit.

The switch circuit selects, from the $2^m+1$ divided voltages, a first divided voltage being higher by a predetermined value (1 LSB of the higher-order conversion circuit×M, where M is an integer) compared with any two of the divided voltages closest to a voltage of the analog signal Vin, and a second divided voltage being lower by the predetermined value (1 LSB of the higher-order conversion circuit×M, where M is an integer) compared therewith.

This configuration favorably eliminates the need for providing a higher-order-bit comparator to each of the divided voltages for higher bits in the higher-order conversion circuit, thereby enabling to suppress the power consumption.

As an example, in the higher-order conversion circuit, a higher-order-bit comparator that is plurally provided for generating higher-order m bits for a digital signal can be reduced in number by excluding divided voltages at least being the highest and lowest in the $2^m-1$ divided voltages for comparison between the divided voltages and an analog signal Vin, e.g., the divided voltage V1-7 in FIG. 2 is the highest, and the divided voltage V1-1 in FIG. 2 is the lowest. Such reduction of the comparators can accordingly suppress the power consumption thereby.

When the first divided voltage is to exceed any of the $2^m+1$ divided voltages being the highest (VRT), the low-order conversion circuit sets the highest divided voltage as the first divided voltage, and sets, as the second divided voltage, any of the $2^m+1$ divided voltages (VRT−(r+1)×1 LSB of the higher-order conversion circuit) being lower than the first divided voltage by a difference of r (r is an even number of 2 or more) of the divided voltages, and when the second divided voltage is to fall below any of the $2^m+1$ divided voltages being the lowest (VRB), the low-order conversion circuit sets the lowest divided voltage as the second divided voltage, and sets, as the first divided voltage (VRT+(r+1)×1 LSB of the higher-order conversion circuit), any of the $2^m+1$ divided voltages being higher than the second divided voltage by a difference of r (r is an even number of 2 or more) of the divided voltages.

As such, there is no more need for divided voltage increase in the divided voltage generation circuit, and in the MUX, the number of switches can be reduced for connection establishment between the divided voltage generation circuit and the lower-order-bit comparators.

Such reduction of the switches can increase the settling speed in the lower-order conversion circuit during comparison in the lower-order-bit comparators, thereby achieving speed enhancement.

Moreover, the lower-order conversion circuit includes a first lower-order-bit comparator and a second lower-order-bit comparator. The MUX includes: $2^m/2$ pieces of a first switch for use to connect, to the first lower-order-bit comparator, any of the $2^m+1$ divided voltages located at an even-numbered position from the lowest divided voltage VRB; and $2^m/2+1$ pieces of a second switch for use to connect, to the second lower-order-bit comparator, any of the $2^m+1$ divided voltages located at an odd-numbered position from the lowest divided voltage VRB, and the MUX performs a divided voltage selection through control over the first and second switches, and outputs a selection result to the first and second lower-order-bit comparators.

With such a configuration, the number of switches can be reduced to a further extent for connection establishment between the divided voltage generation circuit and the lower-order-bit comparators.

Note that, in the embodiment described above, the redundancy in the lower-order conversion circuit is ±1 LSB or ±2 LSB of the higher-order conversion circuit. Alternatively, the redundancy of ±3 LSB or more can also lead to the similar effects.

Moreover, in the above, the lower-order-bit comparator is described as two-input in the lower-order conversion circuit. This is surely not restrictive, and multiple-input such as three-input or more can also lead to the similar effects.

By setting the redundancy of a higher-order conversion circuit to ±1 LSB×M (M is an integer) as such, the comparators in the higher-order conversion circuit can be reduced in number, and the power consumption can be reduced. What is more, the number of reference switches can be reduced, and the load during comparison can be reduced so that the circuit can be enhanced by speed.

It should be understood by those skilled in the art that various modifications, combinations, sub-combinations and alterations may occur depending on design requirements and other factors insofar as they are within the scope of the appended claims or the equivalents thereof.

What is claimed is:

1. A subranging analog-to-digital (AD) converter that converts, for output, an incoming analog signal into an N-bit digital signal, the converter comprising:
   a divided voltage generation circuit that equally divides a range of a predetermined voltage, and generates $2^m+1$ divided voltages;
   a higher-order conversion circuit that generates, for output, a signal for higher-order m bits of the digital signal by comparing the analog signal with the $2^m-1$ or less of the $2^m+1$ divided voltages;
   a switch circuit that selects, for output, at least two of the $2^m+1$ divided voltages based on information provided by the higher-order conversion circuit;
   a lower-order conversion circuit that generates, for output, a signal for lower-order n bits (n=N−m) of the digital signal by comparing the analog signal with the divided voltages being a selection result of the switch circuit; and an encoder that generates the digital signal based on the signal provided by the higher-order conversion circuit and the signal provided by the lower-order conversion circuit, wherein the switch circuit selects, from the $2^m+1$ divided voltages, a first divided voltage being higher by a predetermined value compared with any two of the divided voltages closest to a voltage of the analog signal, and a second divided voltage being lower by the predetermined value compared therewith, when the first divided voltage is to exceed any of the $2^m+1$ divided voltages being the highest, the switch circuit sets the highest divided voltage as the first divided voltage, and sets, as the second divided voltage, any of the $2^m+1$ divided voltages being lower than the first divided voltage by a difference of r (r is an even number of 2 or more) of the divided voltages, and when the second divided voltage is to fall below any of the $2^m+1$ divided voltages being the lowest, the switch circuit sets the lowest divided voltage as the second divided voltage, and sets, as the first divided voltage, any of the $2^m+1$ divided voltages being higher than the second divided voltage by a difference of r (r is an even number of 2 or more) of the divided voltages.

2. The subranging AD converter according to claim 1, wherein the lower-order conversion circuit includes a first lower-order-bit comparator and a second lower-order-bit comparator, and the switch circuit includes:

$2^m/2$ pieces of a first switch for use to connect, to the first lower-order-bit comparator, any of the $2^m+1$ divided voltages located at an even-numbered position from the lowest divided voltage; and $2^m/2$ pieces of a second switch for use to connect, to the second lower-order-bit comparator, any of the $2^m+1$ divided voltages located at an odd-numbered position from the lowest divided voltage, and the switch circuit performs a divided voltage selection through control over the first and second switches, and outputs a selection result to the first and second lower-order-bit comparators.

3. The subranging AD converter according to claim 1 or 2, wherein the higher-order conversion circuit includes a plurality of higher-order comparators for comparing the analog signal with any of the $2^m-1$ divided voltages at least not including the highest and lowest divided voltages.

* * * * *